United States Patent
Frana et al.

(10) Patent No.: US 9,204,580 B2
(45) Date of Patent: Dec. 1, 2015

(54) MOVABLE SHIELDED CABLE EGRESS (71) Applicant: International Business Machines Corporation, Armonk, NY (US)

(72) Inventors: Andrew J. Frana, Oronoco, MN (US); Ross T. Fredericksen, Mantorville, MN (US); Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 14/138,356

(22) Filed: Dec. 23, 2013

(65) Prior Publication Data

US 2015/0181771 A1 Jun. 25, 2015

(51) Int. Cl.
H05K 9/00 (2006.01)

(52) U.S. Cl.
CPC .................................. H05K 9/0015 (2013.01)

(58) Field of Classification Search
USPC ............ 361/799, 816, 818; 174/65 R, 60, 64, 174/135; 248/68.1
See application file for complete search history.

(56) References Cited

U.S. PATENT DOCUMENTS

| | | | |
|---|---|---|---|
| 4,764,422 A | 8/1988 | Hill et al. | |
| 6,411,102 B1* | 6/2002 | Gilliland et al. | 324/627 |
| 6,455,776 B1 | 9/2002 | Milne | |
| 6,721,157 B2* | 4/2004 | Shin | 361/120 |
| 6,858,793 B1 | 2/2005 | Pels et al. | |
| 7,041,903 B2* | 5/2006 | Odahara et al. | 174/659 |
| 7,994,434 B2 | 8/2011 | Benner et al. | |
| 8,517,747 B2 | 8/2013 | Bryla et al. | |
| 2005/0039941 A1* | 2/2005 | Marroquin et al. | 174/78 |
| 2012/0181079 A1 | 7/2012 | Wittkop | |
| 2012/0325546 A1 | 12/2012 | Feldstein et al. | |
| 2013/0228657 A1 | 9/2013 | Sprenger et al. | |
| 2014/0076443 A1* | 3/2014 | Cesak et al. | 137/855 |

FOREIGN PATENT DOCUMENTS

| | | |
|---|---|---|
| CN | 2135853 Y | 6/1993 |
| CN | 201038680 Y | 3/2008 |
| CN | 201839550 U | 5/2011 |
| JP | 2012156360 A | 8/2012 |

* cited by examiner

Primary Examiner — Hung S Bui
(74) Attorney, Agent, or Firm — Penny L. Lowry; Robert Williams (57) ABSTRACT

A device having an upper plate comprising a top face and a bottom face with an opening. A lower plate comprising a top face and a bottom face substantially parallel to the upper plate, with an opening. A middle plate between and substantially parallel to the upper plate and lower plate, capable of moving with respect to the upper plate and lower plate, and having a top face a bottom face and at least one opening. A plurality of gaskets configured to electrically connect the upper plate, the middle, plate, and the lower plate and provide an interface that is designed to allow the middle plate to slide substantially parallel to the upper plate and the lower plate. At least one waveguide through the at least one opening of the middle plate.

20 Claims, 5 Drawing Sheets

MOVABLE SHIELDED CABLE EGRESS

BACKGROUND

This disclosure relates generally to electromagnetic interference, and more specifically, regards controlling the level of emissions of electromagnetic interference emitted and absorbed from electrical equipment in an enclosure. Electromagnetic interference (EMI) is a disturbance that interrupts, obstructs, degrades, or limits the effective performance of electronics and electrical equipment. It can occur unintentionally as a result of spurious emissions and responses. Electromagnetic compatibility (EMC) refers to ensuring tries to ensure that equipment items or systems will not interfere with or prevent the correct operation of other equipment items or systems through emission or absorption of EMI.

SUMMARY

Disclosed herein are embodiments of a device for attenuating electromagnetic emissions. In various embodiments, the device may include an upper plate having a first top face, a first bottom face and a first opening spanning from the first top face to the first bottom face. The device may also include a lower plate substantially parallel to the upper plate and having a second top face a second bottom face, and a second opening spanning from the second top face to the second bottom face. In addition, the device may include a middle plate between and substantially parallel to the upper plate and lower plate, capable of moving with respect to the upper plate and lower plate, and having a third top face a third bottom face and at least one third opening spanning from the third top face to the third bottom face. Also, the device may include a first gasket physically connected to the first bottom face of the upper plate, bordering the first opening, and electrically connecting the upper plate and the middle plate. Consistent with various embodiments, the device may also include a second gasket physically connected to the second top face of the lower plate, bordering the second opening, and electrically connecting the lower plate and the middle plate. In addition, the device may include a third gasket physically connected to the third top face of the middle plate, bordering at least one edge of the third top face of the middle plate, and electrically connecting the upper plate and the middle plate. Also, the device may include a fourth gasket physically connected to the third bottom face of the middle plate, bordering at least one edge of the third bottom face of the middle plate, and electrically connecting the lower plate and the middle plate. Furthermore, the device may include at least one waveguide that extends through the at least one third opening spanning at least from the first top face of the upper plate to the second bottom face of the lower plate.

Also disclosed herein are embodiments of a device allowing movability of an egress for cables. In various embodiments, the device may include an upper plate comprising a first top face and a first bottom face, with a first opening spanning from the first top face to the first bottom face. The device may also include a lower plate comprising a second top face and a second bottom face, substantially parallel to the upper plate and with a second opening spanning from the second top face to the second bottom face. In addition, the device may include a middle plate between and substantially parallel to the upper plate and lower plate, capable of moving with respect to the upper plate and lower plate, and having a third top face a third bottom face and at least one third opening spanning from the third top face to the third bottom face. Also, the device may include a plurality of gaskets configured to electrically connect the upper plate, the middle, plate, and the lower plate and provide an interface that is designed to allow the middle plate to slide substantially parallel to the upper plate and the lower plate. Furthermore, the device may include at least one waveguide through the at least one third opening spanning at least from the first top face of the upper plate to the second bottom face of the lower plate.

Also disclosed herein are embodiments of an enclosure allowing movability of an egress for cables. In various embodiments, the enclosure may include a container having a first opening. In addition, the enclosure may include a device comprising an upper plate comprising a first top face and a first bottom face, configured to substantially seal the first opening of the container, and having a second opening spanning from the first top face to the first bottom face. The device may also include a lower plate comprising a second top face and a second bottom face, substantially parallel to the upper plate and with a third opening spanning from the second top face to the second bottom face. In addition, the device may include a middle plate between and substantially parallel to the upper plate and lower plate, capable of moving with respect to the upper plate and lower plate, and having a third top face a third bottom face and at least one fourth opening spanning from the third top face to the third bottom face. Also, the device may include a plurality of gaskets configured to electrically connect the upper plate, the middle, plate, and the lower plate and provide an interface that is designed to allow the middle plate to slide substantially parallel to the upper plate and the lower plate. Furthermore, the device may include at least one waveguide through the at least one fourth opening spanning at least from the first top face of the upper plate to the second bottom face of the lower plate.

DETAILED DESCRIPTION

Electromagnetic energy from sources external or internal to electrical equipment affects that equipment adversely by causing it to have undesirable responses, such as degraded performance or malfunctions. When this occurs, the electromagnetic energy is called electromagnetic interference (EMI), and the adversely affected equipment is said to be susceptible to EMI. The damaging effects of EMI may pose unacceptable risks in many areas of technology and it may be necessary to control EMI and reduce the risks to acceptable levels.

EMI is radiated through openings in equipment enclosures, including but not necessarily limited to openings relating to one or more of: ventilation access; cable or meter holes; around the edges of doors, hatches, drawers, and panels; and through imperfect joints in the enclosures. EMI may also be radiated from leads and cables connected to an electrical equipment, or picked up by leads and cables connected to susceptible electrical equipment.

The present disclosure relates to a system and a device for restricting the emission and absorption of EMI radiation by electrical equipment. The electrical equipment may be within an enclosure that is part of the system. The device may have three layered plates and each plate may have at least one opening. The openings may be aligned, one on top of the other, and provide an egression for cables coming from the electrical equipment. Also, the middle plate may have an opening smaller than the opening of the upper and lower plates. The middle plate and, consequently, the cables, may then be capable of shifting from one position to another. This may allow the cables to be moved when maintenance is performed on the electrical equipment, without forcing the electrical equipment offline. Furthermore, because the opening on the middle plate may be smaller than the openings on the upper and lower plates, adequate shielding may be provided, limiting the emission and absorption of EMI radiation.

Figure 1:
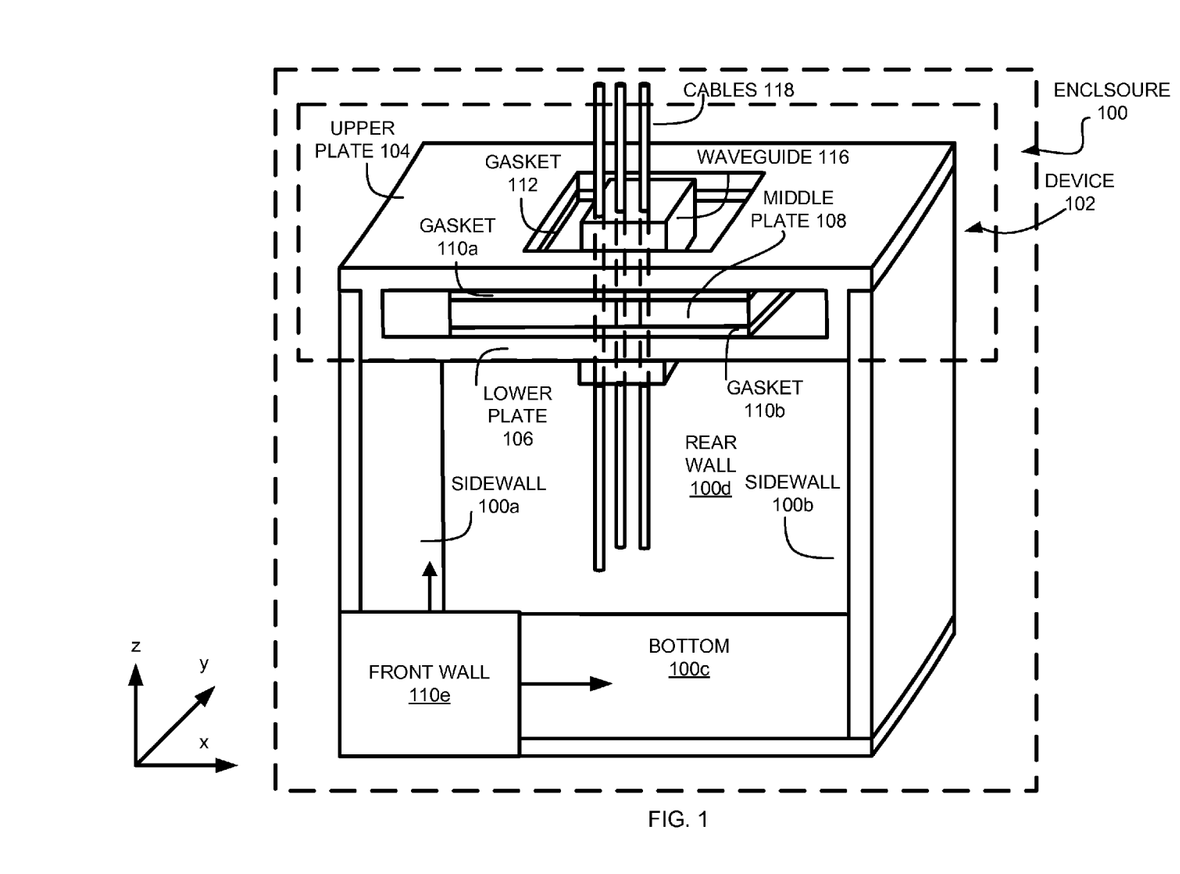
FIG. 1 depicts an enclosure for a moveable shielded cable egress, consistent with embodiments of the present disclosure.

Turning now to the figures, FIG. 1 depicts an enclosure 100 for a moveable shielded cable egress, consistent with embodiments of the present disclosure. The enclosure 100 may include a device 102 and sidewalls 100a and 100b, bottom 100c, rear wall 100d, and front wall 110e.

The electromagnetic enclosure 100 may be configured to attenuate EMI between sources and susceptible equipment. Enclosure 100 reduces EMI when EMI fields induce circulation currents in the enclosure and the fields set up by those circulating currents oppose the EMI fields, so that the net fields on the lower side of the enclosure may be reduced. Enclosure 100 may also attenuate EMI fields by a combination of reflection and absorption. Furthermore, the law of reciprocity applies. Enclosure 100 may be thought of as containing EMI emanating from an internal source, or excluding EMI from reaching susceptible equipment. For an enclosed source, the EMI level outside enclosure 100 may be reduced below the level inside the enclosure 100 and susceptible equipment may benefit. When an electromagnetic wave impinges on enclosure 100, some of the wave's energy is reflected at the surface of the enclosure, some is absorbed by the enclosure, and some is transmitted through the enclosure.

For good isolation enclosure 100, may be fabricated from a single, homogeneous piece of material, without seams, joints, or openings. When an opening is provided for periodic inspection, maintenance, repair, or other purpose, it may be equipped with a cover, door, window, or panel of the same material as the enclosure. However, joints or openings represent an anomaly in the continuity of the enclosure surface and is subject to leakage. A gasket may seal joints in such a way as to restore the enclosure integrity as essentially, a one piece element.

Furthermore, electrical equipment inside a single piece enclosure may be protected because current from electromagnetic waves may not circulate on the inside wall of an enclosure. The enclosure may not entirely absorb an electromagnetic field, but has current running along its surface that creates a separate electromagnetic field to cancel the effects of the original field. As electromagnetic currents typically take the path of least impedance, they run along the exterior of the enclosure. An opening in the enclosure may cause the current flow to be diverted around the opening. This increase in impedance may cause an electromagnetic wave or EMI to propagate from the opening.

As illustrated, device 102 may include an upper plate 104. Upper plate 104 may be composed of a conductive material. Upper plate 104 may operate as a sidewall, top, front, bottom, rear wall or front wall of enclosure 100. The use of a conductive material for upper plate 104 may maintain a low impedance connection between upper plate 104 and enclosure 100, therefore, providing a good connection for current to travel along enclosure 100. Furthermore, upper plate 104 may have an opening. The opening may allow for cables 118, which may be connected to electrical equipment (not shown) inside enclosure 100, to be positioned and repositioned in one or more of the x, y and z planes or directions.

In certain embodiments, upper plate 104 may be coupled to lower plate 106. Lower plate 106 may also be formed in a shape that allows for it to be placed adjacent to one or more of sidewall 100a, 100b, bottom 100c, rear wall 100d, or front wall 110e. In another embodiment, upper plate 104 may act as sidewall 100a of enclosure 100 and lower plate 106 may then be placed adjacent to one or more of the sidewalls, rear wall 100d, bottom 100c, and a top wall (not shown). By having an adjacency, lower plate 106 may establish a surface contact with enclosure 100, which may exhibit lower impedance than a point contact and decrease the EMI emissions. A surface contact may exhibit a lower-impedance than a point contact because a surface contact may establish a better electrical connection than a point contact for current to travel, therefore, lowing the impedance and decreasing EMI emissions. Furthermore, lower plate 106 may be composed of a conductive material. The use of a conductive material for lower plate 106 may maintain a low impedance connection between upper plate 104 and enclosure 100, therefore, providing a good connection for current to travel along enclosure 100. Lower plate 106 may also have an opening. The opening may allow for cables 118, which may be connected to electrical equipment (not shown) inside system 100, to be positioned and repositioned in one or more of the x, y and z planes or directions.

As shown in FIG. 1, middle plate 108 may be between upper plate 104 and lower plate 106. Middle plate 108 may have an opening smaller than the openings on upper plate 104 and lower plate 106. In some embodiments, middle plate 108 is designed to move in the xy plane relative to either, or both, upper plate 104 or lower plate 106. Furthermore, cables 118 may go through the opening of middle plate 108 and the position of the opening on middle plate 108 in the xy plane may change to allow the position of cables 118 to change relative to the rest of the enclosure.

Cable egress and ingress from an enclosure and cable position within an enclosure may be a source of many problems. For instance, when servicing an enclosure housing electrical equipment the cables may interfere with the moving of assemblies, subassemblies, drawers, etc. Also, an electrical apparatus of the electrical equipment and the cable density may be such that servicing either may result in accessibility issues and force the electrical apparatus offline. Furthermore, increasing the size of cable egress and ingress openings may interrupt basic system operation. For example, a large opening may not have the shielding properties necessary to prevent EMI emissions from propagating out of the enclosure, e.g., enclosure 100, or entering the enclosure and may cause the electrical equipment to malfunction.

A moveable middle plate 108 with an opening configured to allow for the egress and ingress of cables 118 may allow for the position and reposition of cables 118 when maintenance is being done on electrical equipment housed within enclosure 100. An electrical apparatus may also be installed and removed from electrical equipment in enclosure 100 without removing cables 118. Furthermore, by fitting middle plate 108 between upper plate 104 and lower plate 106, the opening may be small enough to continue to provide electrical equipment in enclosure 100 the necessary shielding from EMI emissions.

In various embodiments, a waveguide 116 may be placed through the opening in middle plate 108. Waveguide 116 may limit the level of EMI emitted by cables 118 and provide additional shielding to cables 118 from EMI emissions from outside sources. When EMI is emitted, it propagates by the process of electrical coupling. Electrical coupling is the transfer of energy from one medium to another. There are four basic coupling mechanisms: conductive, capacitive, inductive, and radiative. Radiative coupling occurs when source and receptor operate as radio antennas, that is, the source emits an electromagnetic wave which propagates across open space and is received by the receptor. Cables 118, may operate as antennas, which makes them and the electrical apparatus they are connected to, susceptible to absorbing and emitting radiated EMI. Waveguide 116 may be a structure that guides waves and may be made of conductive or dielectric materials. Waves propagating in open space may come into contact with waveguide 116. The waves may be confined inside the waveguide 116 due to total reflection from the waveguide, thus, limiting the emission or absorption of EMI by cables 118. Furthermore, waveguide 116 may be of a shape that gives middle plate 108 increased shielding properties.

As illustrated, device 102 may be fitted with gaskets 110a, 110b, 112. Consistent with various embodiments, gaskets 110a and 110b may be physically connected to the edges of middle plate 108. Gaskets 110a and 110b may be physically connected to the edges of middle plate 108 in various ways such as a conductive adhesion, an indent in middle plate 108, a conductive fastening pin, etc. Gaskets 110a and 110b may also be in contact with upper plate 104 and lower plate 106, but not physically connected so that middle plate may move relative to upper plate 104 and lower plate 106. Gasket 112 may be physically connected to upper plate 104 in relatively the same way as gaskets 110a and 110b are connected to middle plate 108. Furthermore, gasket 112 may be in contact with middle plate 108, but not physically connected so that middle plate 108 may move relative to upper plate 104 and lower plate 106. A gasket (not shown) may also be physically connected to lower plate 106. The gasket may be physically connected to lower plate 106 in relatively the same way as gaskets 110a and 110b are connected to middle plate 108. Furthermore, the gasket may be in contact with middle plate 108, but not physically connected so that middle plate 108 may move relative to upper plate 104 and lower plate 106.

As stated herein, electromagnetic currents typically take the path of least impedance and a gap or opening may allow emissions to radiate. The gap may display a high-level of impedance and may not allow the current to flow along device 102 and enclosure 100. This may cause EMI to be radiated and interfere with the electrical equipment inside system 100. Gaskets 110a, 110b, 112 may provide an electrical connection between upper plate 104, middle plate 108, and lower plate 106 and allow for the current to flow along device 102 and enclosure 100.

Furthermore, as stated herein, middle plate 108 may be configured to move relative to upper plate 104 and lower plate 106 and depending on the positioning and repositioning of cables 118. This may cause middle plate 108 to experience shear stress from both upper plate 104 and lower plate 106. Shear stress arises from the force parallel to the cross section of a surface, such as the force exerted by the surfaces of upper plate 104 and lower plate 106 on the surface of middle plate 108. Therefore, gaskets 110a, 110b, and 112 may be capable of reducing the shear stress experienced by middle plate 108 (e.g., by providing a low friction interface) and allow middle plate 108 to slide between upper plate 104 and lower plate 106.

Figure 2A:
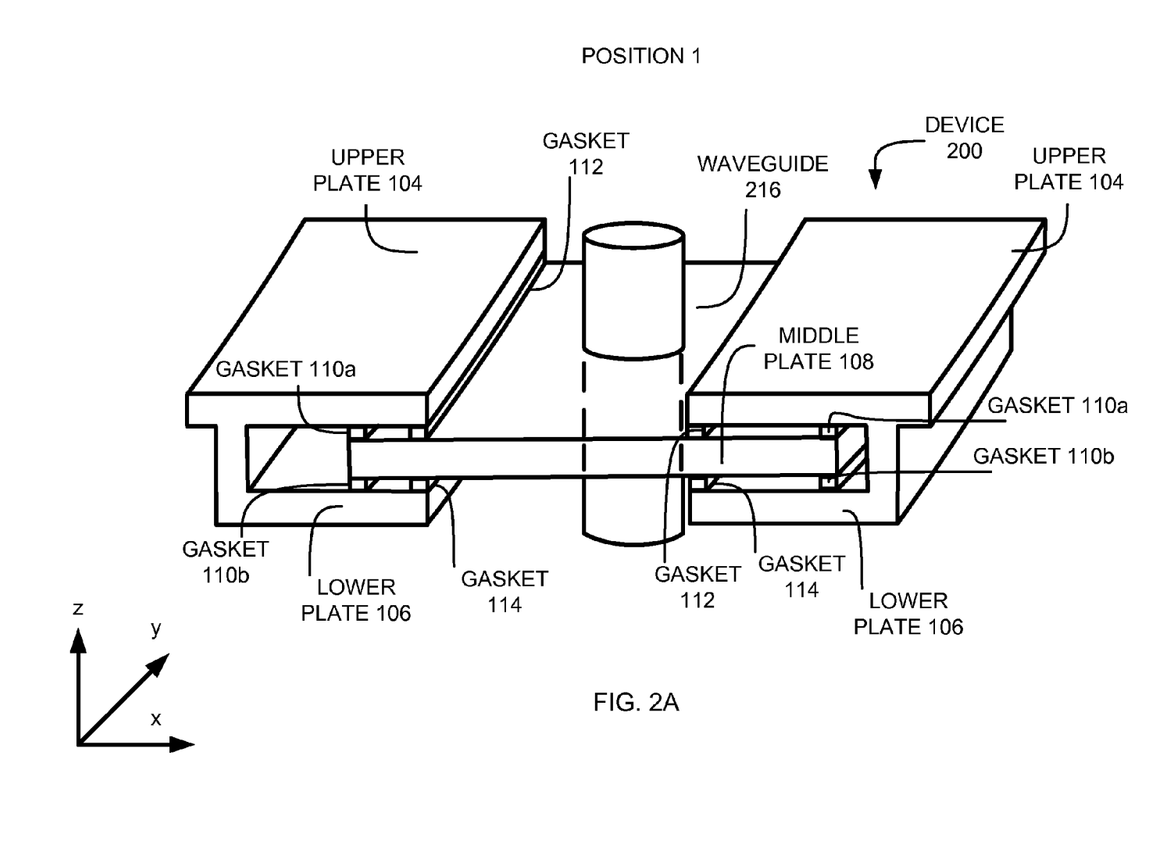
FIG. 2A depicts an example of a cross section of a device for moveable shielded cable egress in a first position, consistent with embodiments of the present disclosure.

FIG. 2A depicts an example of a cross section of a device 200 for moveable shielded cable egress in a first position, consistent with embodiments of the present disclosure. The device 200 may include an upper plate 104, a lower plate 106, a middle plate 108, gaskets 110a, 110b, 112, 114, and waveguide 216. Upper plate 104, lower plate 106, middle plate 108, gaskets 110a, 110b, and 112 may be configured and may operate in relatively the same manner as discussed above for device 102. As shown in FIG. 2A, device 200 includes gasket 114. Gasket 114 may be physically connected to lower plate 106 in various ways such as a conductive adhesion, an indent in middle plate 108, a conductive fastening pin, etc. Furthermore, gasket 114 may be in contact with middle plate 108, but not physically connected so that middle plate 108 may move relative to upper plate 104 and lower plate 106. Gaskets 114 may also provide an electrical connection between middle plate 108 and lower plate 106. This may allow for the current to flow along device 200 and enclosure 100, shown in FIG. 1. Also, gasket 114 may be capable of absorbing the frictional force experienced when middle plate 108 moves relative to lower plate 106.

In various embodiments, waveguide 216 may be placed through the opening in middle plate 108. As illustrated in FIG. 2A, waveguide 216 may be in the shape of a cylinder and may be located at position 1 in the xy plane. Position 1 of the opening in middle plate 108 and consequently, waveguide 216, may be determined by the positions of the cables attached to electrical equipment within an enclosure, i.e., enclosure 100.

Figure 4:
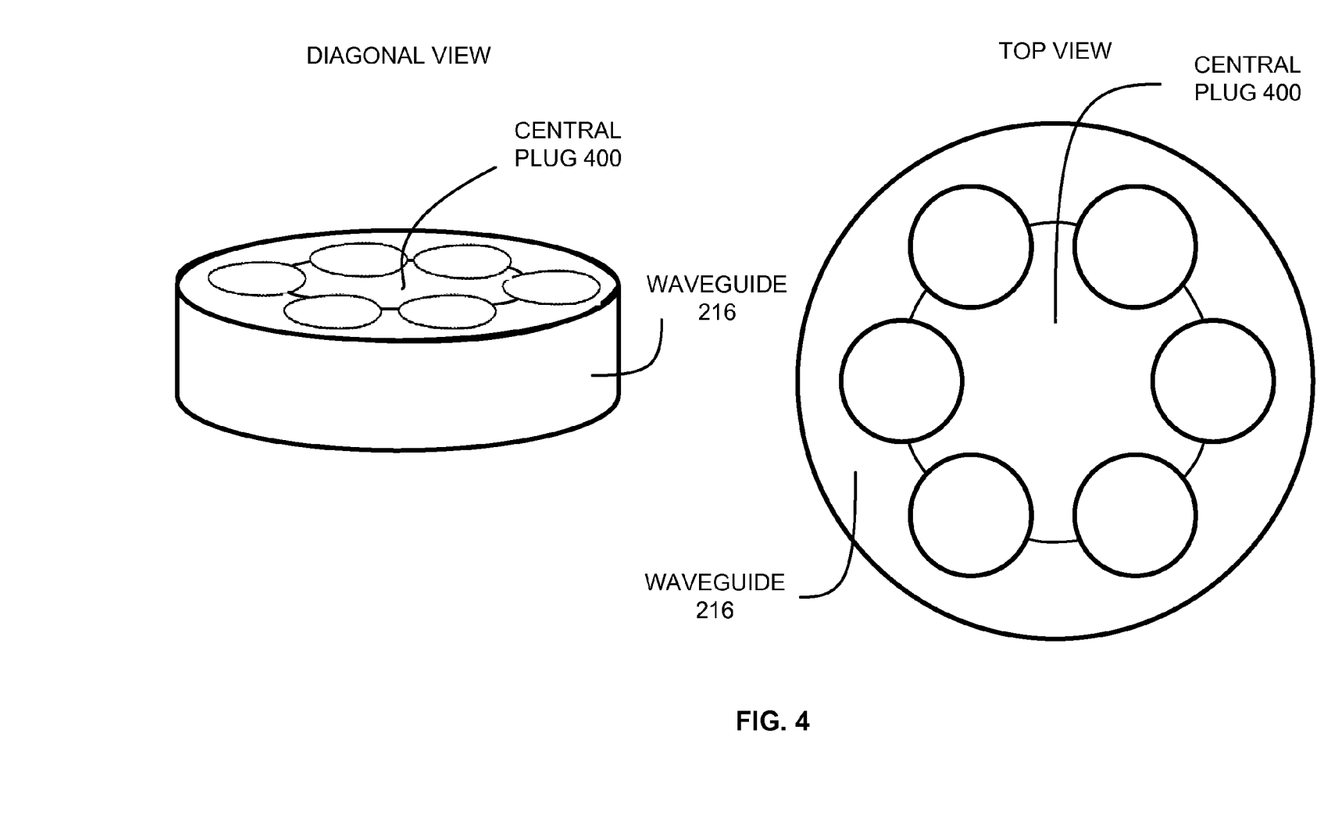
FIG. 4 depicts a diagonal view and a top view of an example of a cross section of a waveguide fitted with a central plug, consistent with embodiments of the present disclosure.

In another embodiment, waveguide 216 may have grooves on its inner wall that are capable of receiving cables and partially surround the circumference of the cables. Waveguide 216 may then be fitted with a central plug 400 as shown in FIG. 4. FIG. 4 depicts a diagonal view and a top view of an example of a cross section of a waveguide 216 fitted with a central plug 400, consistent with embodiments of the present disclosure. As illustrated, central plug 400 may have grooves on its outer wall that are capable of surrounding the remaining circumference of the cables, left open by waveguide 216. The size of central plug 400 may be determined by the size of waveguide 216. Also, the grooves on central plug 400 may need to match up with the grooves on waveguide 216. Therefore, the number of grooves on waveguide 216 and central plug 400 may be determined by the number of cables that are attached to electrical equipment within an enclosure. Furthermore, central plug 400 may provide waveguide 216 and, thus, device 200, with increased shielding properties.

Figure 2B:
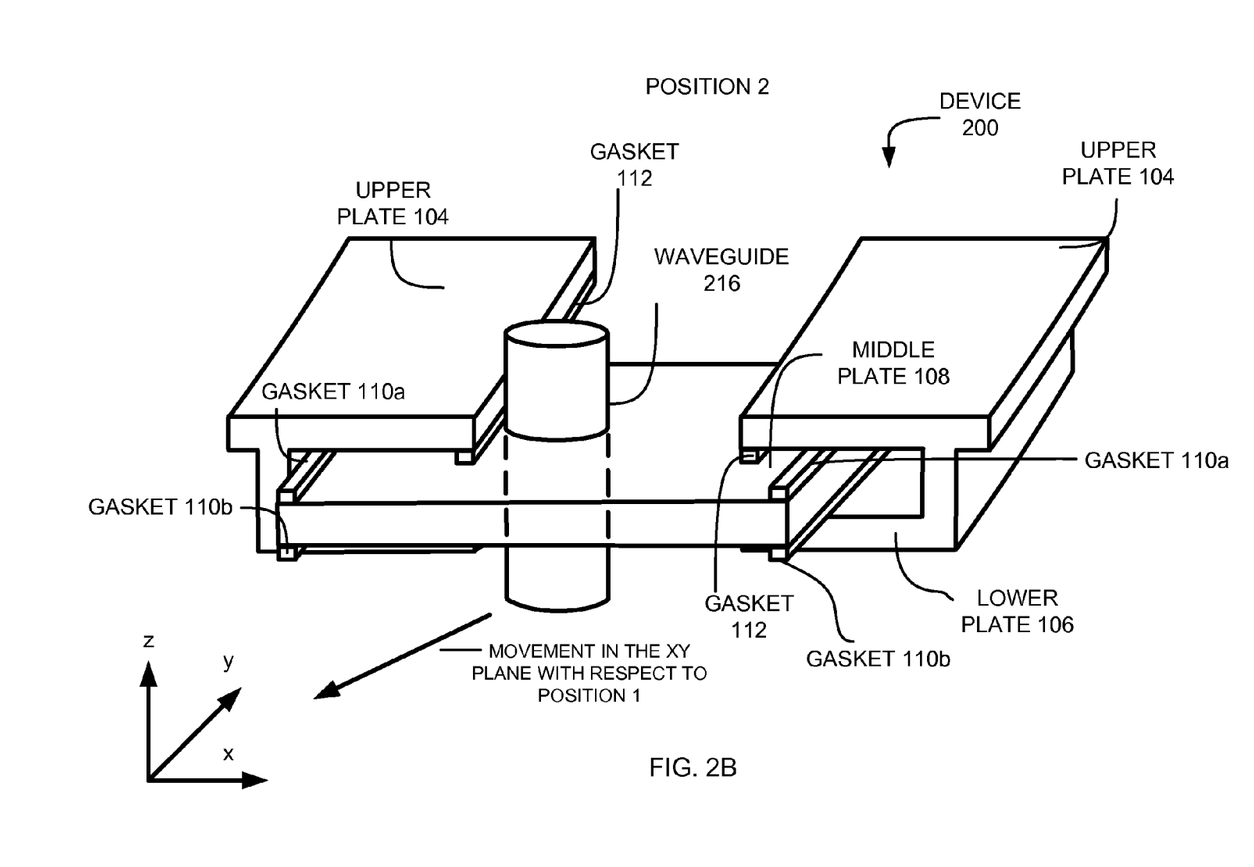
FIG. 2B depicts an example of the cross section of the device for moveable shielded cable egress in a second position, consistent with embodiments of the present disclosure.

FIG. 2B depicts an example of the section of the device 200 for moveable shielded cable egress in a second position, consistent with embodiments of the present disclosure. As shown, the opening in middle plate 108 and consequently, waveguide 216, may be located at position 2 in the xy plane. Position 2 may be determined by the repositioning of the cables attached to electrical equipment within an enclosure, e.g., enclosure 100. For example, it may be necessary to perform maintenance on electrical equipment within an enclosure. It may be determined that an electrical apparatus of the electrical equipment may need to be relocated inside the enclosure to make room for an additional electrical apparatus to the electrical equipment. The relocation of the electrical apparatus and addition of another electrical apparatus may cause problems with the cable position and the current cable egress. By moving the opening in middle plate 108 from position 1 to position 2, the cables may be placed in a location that may not interfere with the moving of the electrical apparatus, may allow the addition of an electrical apparatus while the current electrical equipment remains online, and may maintain the shielding necessary for the electrical equipment.

Figure 3:
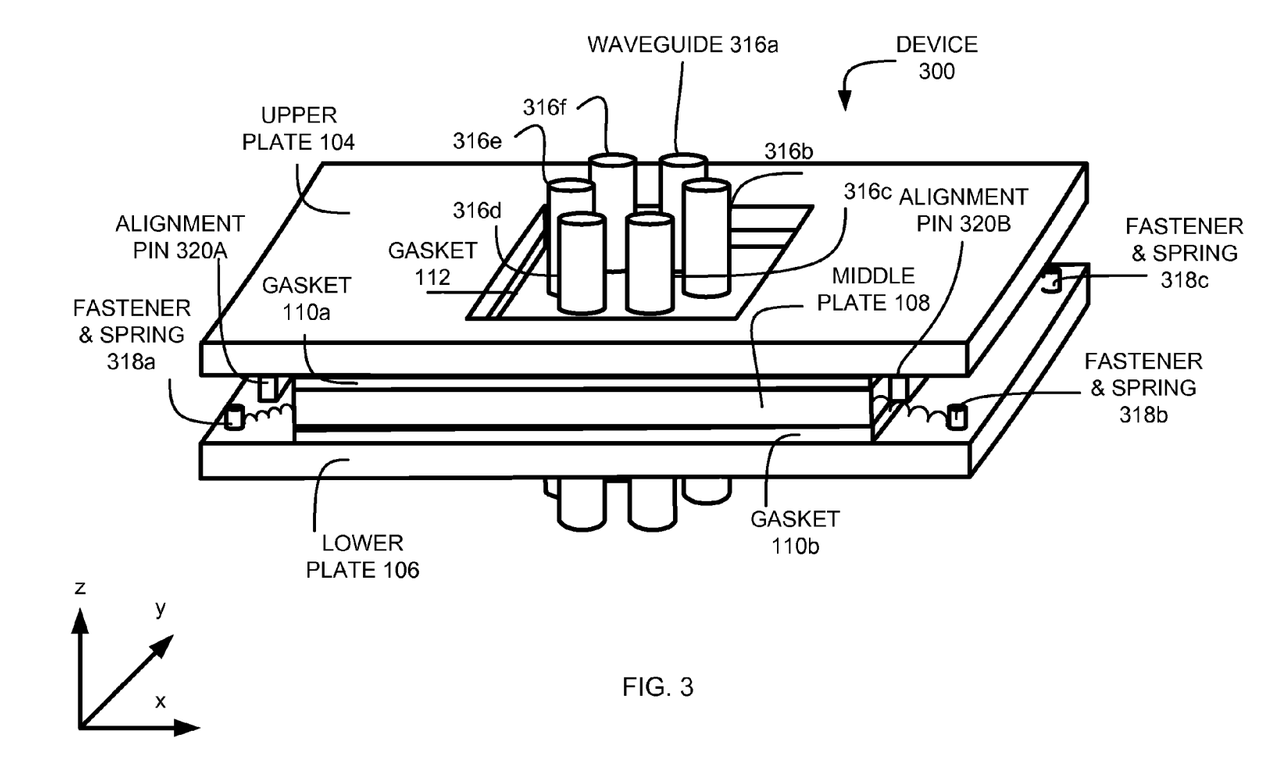
FIG. 3 depicts a device for moveable shielded cable egress with alignment considerations, consistent with embodiments of the present disclosure.

FIG. 3 depicts a device 300 for moveable shielded cable egress with alignment considerations, consistent with embodiments of the present disclosure. Device 300 may include an upper plate 104, an lower plate 106, a middle plate 108, gaskets 110a, 110b, 112, waveguides 316a, 316b, 316c, 316d, 316e, 316f, fasteners and springs 318a, 318b, 318c, and alignment pins 320a and 320b. Upper plate 104, lower plate 106, middle plate 108, gaskets 110a, 110b, and 112 may be configured and may operate in relatively the same manner as discussed above for device 102.

As shown in FIG. 3, alignment pins 320a and 320b may be physically connected to upper plate 104. Alignment pins 320a and 320b may be used to place middle plate 108 into a locked or detent position for permanent fixed locations or for holding cables, e.g., cables 118, from FIG. 1. The cables may need to be placed in a fixed location while maintenance may be performed on electrical equipment inside an enclosure, to keep the cables from interfering with equipment inside an enclosure, etc. Alignment pins 320a and 320b may be physically connected to upper plate 104, however, they may also be physically connected to lower plate 106 or other locations on device 300 that may provide the necessary placement of middle plate 108 into a locked or detent position. Furthermore, there may be more or less alignment pins depending on various embodiments.

As illustrated, fasteners and springs 318a, 318b, and 318c may be physically connected to lower plate 106. Fasteners and springs 318a, 318b, and 318c may be used to reposition middle plate 108 and consequently cables 118. It may be necessary to reposition cables 118 for several reasons such as unintentional shock, outside vibrations, etc., that cause middle plate 108 to move relative to upper plate 104 and lower plate 106. One end of a fastener may be physically connected to a plate and the other end of the fastener may be capable of receiving a spring. Fasteners and springs 318a, 318b, and 318c may be physically connected to lower plate 106, however, they may also be physically connected to upper plate 104 or other locations on device 300 that may provide the necessary repositioning of the cables. Furthermore, there may be more or less fasteners and springs as depicted in FIG. 3 depending on various embodiments.

In various embodiments, waveguides 316a, 316b, 316c, 316d, 316e, and 316f may be placed through the opening in middle plate 108. As illustrated in FIG. 3, waveguides 316a-316f may be in the shape of cylinders and waveguides 316a-316f may allow for an individual cable to egress from an individual waveguide. Therefore, the number of waveguides 316a-316f may be determined by the number of cables that are attached to electrical equipment within an enclosure. Furthermore, having numerous waveguides that allow for individual cables to egress from individual waveguides may increase the shielding properties of device 300.

While the invention has been described with reference to specific embodiments thereof, those skilled in the art will be able to make various modifications to the described embodiments without departing from the true spirit and scope of the embodiments. The terms and descriptions used herein are set forth by way of illustration only and are not meant as limitations. Those skilled in the art will recognize that these and other variations are possible within the spirit and scope of the embodiments as defined in the following claims and their equivalents.

What is claimed is:

1. A device for attenuating electromagnetic emissions, the device comprising:
   an upper plate having a first top face, a first bottom face and a first opening spanning from the first top face to the first bottom face;
   a lower plate substantially parallel to the upper plate and having a second top face a second bottom face, and a second opening spanning from the second top face to the second bottom face;
   a middle plate between and substantially parallel to the upper plate and lower plate, capable of moving with respect to the upper plate and lower plate, and having a third top face a third bottom face and at least one third opening spanning from the third top face to the third bottom face;
   a first gasket physically connected to the first bottom face of the upper plate, bordering the first opening, and electrically connecting the upper plate and the middle plate;
   a second gasket physically connected to the second top face of the lower plate, bordering the second opening, and electrically connecting the lower plate and the middle plate;
   a third gasket physically connected to the third top face of the middle plate, bordering at least one edge of the third top face of the middle plate, and electrically connecting the upper plate and the middle plate;
   a fourth gasket physically connected to the third bottom face of the middle plate, bordering at least one edge of the third bottom face of the middle plate, and electrically connecting the lower plate and the middle plate; and
   at least one waveguide that extends through the at least one third opening spanning at least from the first top face of the upper plate to the second bottom face of the lower plate.

2. The device of claim 1, further comprising:
   at least one fastener having a first end physically connected to the device and a second end capable of receiving a spring;
   at least one spring physically connected to the at least one pin, positioned to substantially absorb shock and vibration and reposition the middle plate;
   at least one pin physically connected to the device positioned to substantially affix the middle plate into a locked position; and
   a central plug having an outer edge substantially bordering the at least one third opening and at least one opening substantially bordering the at least one waveguide.

3. The device of claim 1, wherein the upper plate, the lower plate, and the middle plate are composed of conductive material.

4. The device of claim 1, wherein the at least one waveguide substantially borders the at least one third opening.

5. The device of claim 1, wherein the lower plate is coupled to the upper plate and is substantially adjacent to a wall of an enclosure.

6. The device of claim 1, wherein the first opening and the second opening are substantially of a first size and the at least one third opening is substantially of a second size that is different than the first size.

7. The device of claim 6, wherein the first gasket, the second gasket, the third gasket, and the fourth gasket provide an interface that is designed to allow the middle plate to slide substantially parallel to the upper plate and the lower plate.

8. A device allowing movability of an egress for cables, the device comprising:

an upper plate comprising a first top face and a first bottom face, with a first opening spanning from the first top face to the first bottom face;

a lower plate comprising a second top face and a second bottom face, substantially parallel to the upper plate and with a second opening spanning from the second top face to the second bottom face;

a middle plate between and substantially parallel to the upper plate and lower plate, capable of moving with respect to the upper plate and lower plate, and having a third top face a third bottom face and at least one third opening spanning from the third top face to the third bottom face;

a plurality of gaskets configured to electrically connect the upper plate, the middle, plate, and the lower plate and provide an interface that is designed to allow the middle plate to slide substantially parallel to the upper plate and the lower plate; and at least one waveguide through the at least one third opening spanning at least from the first top face of the upper plate to the second bottom face of the lower plate.

9. The device of claim 8, further comprising:

at least one fastener having a first end physically connected to the device and a second end capable of receiving a spring;

at least one spring physically connected to the at least one pin, positioned to substantially absorb shock and vibration and reposition the middle plate;

at least one pin physically connected to the device positioned to substantially affix the middle plate into a locked position; and a central plug having an outer edge substantially bordering the at least one third opening and at least one opening substantially bordering the at least one waveguide.

10. The device of claim 8, wherein the upper plate, the lower plate, and the middle plate are composed of conductive material.

11. The device of claim 8, wherein the at least one waveguide substantially borders the at least one third opening.

12. The device of claim 8, wherein the lower plate is coupled to the upper plate and is substantially adjacent to a lower wall of an enclosure.

13. The device of claim 8, wherein the first opening and the second opening are substantially of a first size and the at least one third opening is substantially of a second size that is different from the first size.

14. The device of claim 8, wherein the plurality of gaskets comprises:

a first gasket physically connected to the first bottom face of the upper plate, bordering the first opening;

a second gasket physically connected to the second top face of the lower plate, bordering the second opening;

a third gasket physically connected to the third top face of the middle plate, bordering at least one edge of the third top face of the middle plate; and a fourth gasket physically connected to the third bottom face of the middle plate, bordering at least one edge of the third bottom face of the middle plate.

15. An enclosure allowing movability of an egress for cables, the enclosure comprising:

a container having a first opening; and a device comprising:

an upper plate comprising a first top face and a first bottom face, configured to substantially seal the first opening of the container, and having a second opening spanning from the first top face to the first bottom face;

a lower plate comprising a second top face and a second bottom face, substantially parallel to the upper plate and with a third opening spanning from the second top face to the second bottom face;

a middle plate between and substantially parallel to the upper plate and lower plate, capable of moving with respect to the upper plate and lower plate, and having a third top face a third bottom face and at least one fourth opening spanning from the third top face to the third bottom face;

a plurality of gaskets configured to electrically connect the upper plate, the middle, plate, and the lower plate and provide an interface that is designed to allow the middle plate to slide substantially parallel to the upper plate and the lower plate; and at least one waveguide through the at least one fourth opening spanning at least from the first top face of the upper plate to the second bottom face of the lower plate.

16. The enclosure of claim 15, the device further comprising:

at least one fastener having a first end physically connected to the device and a second end capable of receiving a spring;

at least one spring physically connected to the at least one pin, positioned to substantially absorb shock and vibration and reposition the middle plate;

at least one pin physically connected to the device positioned to substantially affix the middle plate into a locked position; and a central plug having an outer edge substantially bordering the at least one fourth opening and at least one opening substantially bordering the at least one waveguide.

17. The enclosure of claim 15, wherein the upper plate, the lower plate, and the middle plate are composed of conductive material.

18. The enclosure of claim 15, wherein the at least one waveguide substantially borders the at least one fourth opening.

19. The enclosure of claim 15, wherein the first opening and the second opening are substantially of a first size and the at least one third opening is substantially of a second size that is different from the first size.

20. The enclosure of claim 15, wherein the plurality of gaskets comprises:

a first gasket physically connected to the first bottom face of the upper plate, bordering the first opening;

a second gasket physically connected to the second top face of the lower plate, bordering the second opening;

a third gasket physically connected to the third top face of the middle plate, bordering at least one edge of the third top face of the middle plate; and a fourth gasket physically connected to the third bottom face of the middle plate, bordering at least one edge of the third bottom face of the middle plate.

* * * * *